(12) United States Patent
Wen

(10) Patent No.: US 6,185,107 B1
(45) Date of Patent: Feb. 6, 2001

(54) MEMS BASED TILE ASSEMBLIES AND METHODS OF FABRICATION

(75) Inventor: Cheng P. Wen, Mission Viejo, CA (US)

(73) Assignee: Raytheon Company, Lexington, MA (US)

(*) Notice: Under 35 U.S.C. 154(b), the term of this patent shall be extended for 0 days.

(21) Appl. No.: 09/220,086

(22) Filed: Dec. 23, 1998

(51) Int. Cl.[7] ............................................. H05K 7/02
(52) U.S. Cl. .................... 361/803; 361/760; 361/762; 361/783; 257/773; 257/774; 257/778; 174/256; 174/260; 174/261; 174/262; 174/266; 228/180.22
(58) Field of Search .................................. 361/803, 760, 361/762, 765, 783; 257/684, 773, 774, 777, 778; 174/250, 255, 256, 260, 261, 262, 266; 228/180.22

(56) References Cited

U.S. PATENT DOCUMENTS

| | | | |
|---|---|---|---|
| 5,371,654 | * | 12/1994 | Beaman et al. ................... 361/744 |
| 5,432,681 | * | 7/1995 | Lindeerman ....................... 361/790 |
| 5,510,655 | * | 4/1996 | Tanielian .......................... 257/774 |
| 5,544,017 | * | 8/1996 | Beilin et al. ....................... 361/790 |
| 5,574,561 | * | 11/1996 | Boudreau et al. .................. 356/399 |
| 6,052,287 | * | 4/2000 | Palmer et al. ...................... 361/767 |

\* cited by examiner

Primary Examiner—Jeffrey Gaffin
Assistant Examiner—David Foster
(74) Attorney, Agent, or Firm—Leonard A. Alkov; Glenn H. Lenzen, Jr.

(57) ABSTRACT

Structures and methods that provide for the vertical alignment of and electrical interconnection of MEMS tiles using metallized elastic spheres and precision pyramid shaped pits etched on the surface of silicon substrates. The methods of producing large area, multi-tile (substrate) structures permit fabrication of phased array antenna transmit/receive subsystems, for example, requiring precision, vertical electrical (DC and RF) interconnects between tiles and frames stacked on top of one another. Metallized, back-to-back, inverted pyramid shaped, vertical via structures are fabricated on high resistivity silicon tiles using micro-electronics mechanical system (MEMS) techniques. Slightly oversize, metallized, elastic spheres are squeezed between two inverted pyramid-shaped indentations to provide electrical conduction and accurate alignment between the substrates.

4 Claims, 2 Drawing Sheets

MEMS BASED TILE ASSEMBLIES AND METHODS OF FABRICATION

BACKGROUND

The present invention generally relates to MEMS-based tile assemblies and methods of fabricating same, and more particularly, to MEMS-based tile assemblies wherein vertical alignment of and electrical interconnection of MEMS tiles is achieved using metallized elastic spheres and precision pyramid shaped pits etched on the surface of silicon substrates. Such MEMS-based tile assemblies may be used to produce large area, multi-tile (substrate), transmit/receive subsystems for use in large area micro-machined phased arrays.

Alignment registration between vertically stacked, conventional high thermal conductivity substrates such as aluminum nitride or beryllium oxide with vertical vias is limited by the accuracy and repeatability of via hole fabrication processes. Replacement of high thermal conductivity, ceramic based substrates with high resistivity, single crystal silicon will allow the fabrication of large area tile array systems, because precision, micron-accuracy, vertical vias can be fabricated with microelectronics based MEMS techniques. Furthermore, large size, precision, flat, silicon wafers and high volume manufacturing techniques are readily available. Replacement of the traditional face-up MMIC/aluminum nitride tile assembly with flip-chip/MEMS based technology will lead to a 3-to-5 fold in subarray cost reduction, enabling fabrication of large area sub-arrays containing on the order of 100 transceiver elements.

Aluminum nitride is the favored dielectric substrate material for high power active radar tile subarray because of its high thermal conductivity and its nontoxic property. However, precision circuitry with vertical via cannot be batch fabricated using conventional techniques because of shrinkage associated with firing the ceramic material. Consequently, via holes must be individually drilled. Maintaining precision aligrnment registration of the vertical via electrical connections from tile to tile is the cost driver of microwave subarray assemblies. Availability of large area, aluminum nitride substrate with built-in multilayer interconnect circuitry and precision vertical via limits the maximum number of transceiver element contained in a subarray.

Accordingly, it is an objective of the present invention to provide for MEMS based tile assemblies and methods of fabricating such tile assemblies. It is a further objective of the present invention to provide for MEMS based tile assemblies and methods of fabricating such tile assemblies that may be used to produce large area, multi-tile (substrate), transmit/receive subsystems for use in large area micro-machined phased arrays.

SUMMARY OF THE INVENTION

To meet the above and other objectives, the present invention provides for the vertical alignment of and electrical interconnection of MEMS tiles using metallized elastic spheres and precision pyramid shaped pits etched on surfaces of silicon substrates. An exemplary method of manufacturing MEMS based tile assemblies, comprises the following steps.

Lower and upper silicon substrates are provided that have metallization patterns formed on adjacent surfaces thereof. Flip chip MMIC devices are connected to the metallization patterns to produce lower and upper MEMS based tile assemblies. Vertical via hole electrical interconnects are formed that interconnect the tile assemblies. The interconnects are formed by providing one or more silicon frames, forming pyramid shaped etched pits in the silicon frames, forming via holes through the silicon frames interconnecting the pyramid shaped etched pits, and forming V-shaped, etched grooves in the silicon substrates. Inner surfaces of the pyramid shaped etched pits, V-shaped, etched grooves and via holes are metallized to form metallized vias. Conducting elastic spheres are disposed in the metallized vias to form the vertical electrical interconnects.

The present invention permits the fabrication of large area, multi-tile (substrate), phased array antenna transmit/receive subsystems, and the like. The present invention also provides for a method of fabricating large area, multi-tile structures, such as transmit/receive subsystems for use in large area micro-machined phased arrays. The large area, multi-tile transmit/receive subsystems comprise precision, vertical electrical (DC and RF) interconnects between tiles, and frames stacked on top of one another.

Metallized, back-to-back, inverted pyramid shaped, vertical vias are fabricated on high resistivity silicon tiles using micro-electronics mechanical system (MEMS) techniques. Slightly oversize, metallized, elastic spheres are squeezed between two inverted pyramid-shaped indentations to provide electrical conduction and accurate alignment between the vertical vias of two substrates. Such tile array architectures may be advantageously use in low-cost, advanced, airborne, active array radar systems, and the like.

BRIEF DESCRIPTION OF THE DRAWINGS

The various features and advantages of the present invention may be more readily understood with reference to the following detailed description taken in conjunction with the accompanying drawings, wherein like reference numerals represent like structural elements, and in which.

DETAILED DESCRIPTION

Currently, there is a great deal of interest in using tile array architectures for use in active array radar antenna systems in order to reduce the size of the antenna systems. In place of traditional building-block transmit/receive modules, a tile array is made of subarrays, each having a stack of circuit-function-specific tiles (ceramic substrates having one or more functions) stacked on top of one another. A transceiver function of a given array element is spread vertically, relying on vertical electrical interconnects to communicate between tiles. Fabrication of precision vertical via electrical connections (RF and DC) through the ceramic tiles and precision alignment of tiles in a stack is a key cost driver in subarray manufacturing. Thermal management of a compact, high power tile array is also a major challenge.

Aluminum nitride is nontoxic and has high thermal conductivity (>160 degree C per watt meter) which makes it a desirable dielectric substrate material for use in high power microwave integrated assemblies. However, aluminum nitride is a ceramic material. Precision circuitry and vertical vias cannot be batch fabricated because of shrinkage associated with firing (hardening of ceramic material from its green state). Holes (via connections) through a ceramic substrate must be individually drilled. Maintaining precision alignment registration of the vertical via connections from tile to tile is critical to the RF performance of the array. The maximum number of transceiver elements contained in a subarray is also constrained by the availability of large area, aluminum nitride substrates with built-in multi-layer interconnect circuitry and precision vertical vias. Both the via drilling operation and the stringent alignment requirement are cost drivers of tile arrays using aluminum nitride substrates, for example.

Figure 1:
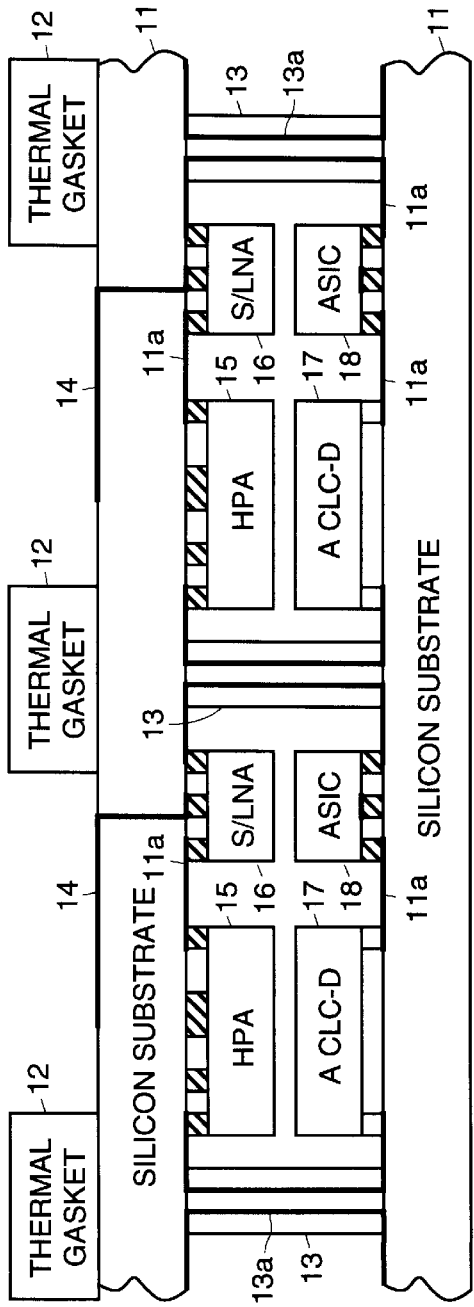
FIG. 1 is a cross sectional side view of a conventional silicon based micromachined membrane tile array flip chip MMIC assembly using multilayer circuitry on a MEMS silicon substrate.

Referring now to the drawing figures, FIG. 1 is a cross sectional side view of a conventional silicon based micromachined membrane tile array flip chip MMIC assembly 10 using multilayer circuitry on MEMS silicon substrates 11. The exemplary assembly 10 comprises lower and upper silicon substrates 11 having metallization patterns 11a formed on adjacent surfaces thereof. The metallization patterns 11a are used to connect to various exemplary circuit devices such as a high power amplifier (HPA) 15, combination switch and low noise amplifier circuit (S/LNA) 16, common leg digital phase shifter (A-CLC/D) 17, and application specific integrated circuit (ASIC) 18, for example. The low noise amplifiers 16 are shown connected to printed circuit antennas 14 formed on an exterior surface of the upper substrate 11. A thermal gasket 12 is also attached to the upper substrate 11. The various circuits attached to the respective substrates 11 are interconnected using conventional silicon frames 13 having integrated feedthroughs 13a, or aperture vertical RF interconnects 13a. The conventional silicon frames 13 are manufactured using micro-electronics mechanical system (MEMS) techniques.

Active array antenna manufacturing costs may be reduced by combining the micro-machined membrane circuitry/packaging (MEMS) technology with flip-chip power MIMIC techniques. High resistivity silicon wafers with precision, chemically formed, three-dimensional circuitry and mechanical structure replace both the aluminum nitride substrates and metal frames used in a conventional tile subarray 10 shown in FIG. 1. This approach is possible because of the excellent thermal conductivity (−150 degree C per watt meter) of high resistivity silicon, which is a single crystal material.

In accordance with the present invention, precision vertical vias and accurate tile-to-tile alignment registration issues are resolved by fabricating tile subarrays using low cost, silicon microelectronics fabrication MEMS techniques. Micron dimension circuit pattern and alignment accuracy is maintained over a large area using the MEMS techniques. In addition, complex, multi-level electrical interconnects on silicon may be fabricated that are used to interconnect between the circuits on the silicon substrates. It is conceivable that a 100 element X-band tile subarray may be fabricated using 8-inch silicon wafers, representing a paradigm shift in tile array technology. A 25-fold subarray size increase will lead to an estimated 3 to 5 fold reduction in manufacturing costs. The size of a MEMS technology based subarray is only limited by manufacturing yield and mechanical stability considerations.

Figure 2:
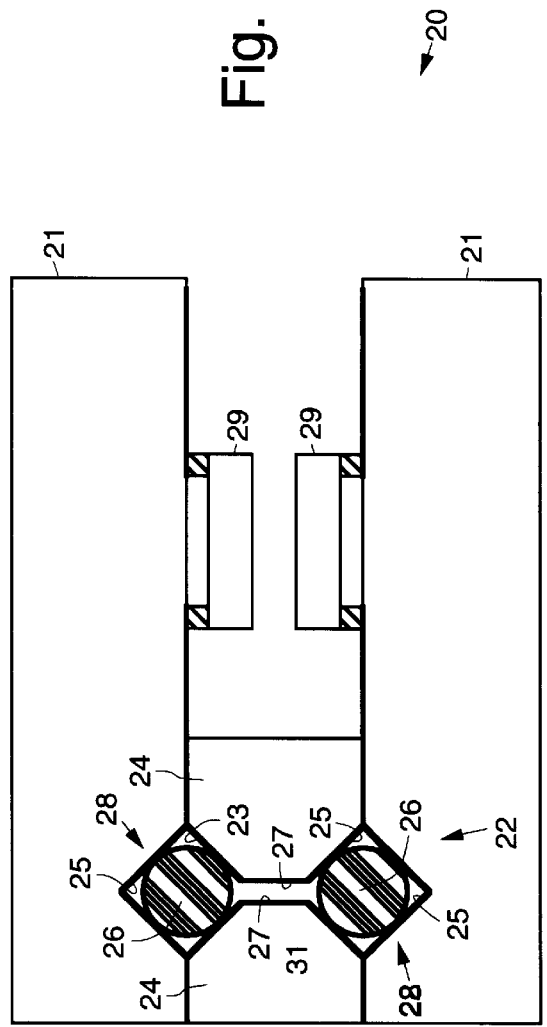
FIG. 2 illustrates an exemplary MEMS based tile assembly using precision vertical via electrical interconnects in accordance with the principles of the present invention that may be used to produce a multi-tile transmit/receive subsystem for use in a large area micro-machined phased array.

Referring now to FIG. 2, it illustrates an exemplary MEMS based tile assembly 20 using precision vertical via electrical interconnects 22 in accordance with the principles of the present invention. Such MEMS based tile assemblies 20 may be used to produce a multi-tile transmit/receive subsystem for use in a large area micro-machined phased array. The exemplary MEMS based tile assembly 20 comprises a plurality of (lower and upper) silicon substrates 21 having flip chip MMIC devices 29 attached thereto. The flip chip MMIC devices 29 are interconnected by means of a plurality of silicon frames 24 that provide vertical electrical interconnects 22 between the silicon substrates 21 and the flip chip MMIC devices 29.

FIG. 2 shows the manner in which tiles may be interconnected to produce a multi-tile transmit/receive subsystem, for example, for use in a large area micro-machined phased array. Precision vertical via hole electrical interconnects 22 and tile-to-tile registration is accomplished in the following manner. Pyramid shaped etched pits 23 are formed in silicon frames 24, and V-shaped, etched grooves 25 are formed in the silicon substrates 21. Via holes 31 are formed through the silicon frames to interconnect the pyramid shaped etched pits 23. Small glass spheres (not shown) are used to assure precision layer-to-layer alignment.

Inner surfaces of the pyramid shaped etched pits, V-shaped, etched grooves and via holes 31 are metallized to form metallized vias 27. The vertical electrical interconnects 22 are formed by wedging conducting elastic spheres 26 into the metallized vias 27 having an inner surface in the shape of an inverted pyramid 28 formed by the V-shaped, etched grooves 25 as is shown in FIG. 2. The surface of the elastic spheres 26 must be able to conduct electrical current so that electrical conductivity is maintained from one tile to another. The diameter of the elastic spheres 26 is large enough so that they are slightly compressed at contact areas at surface of the spheres 26 and the inner wall of the etched inverted pyramids 28 formed by the V-shaped, etched grooves 25. Also, the spheres 26 must be elastic enough so that the two opposite surfaces of the silicon tiles are pressed against one another with the spheres 26 wedged between them.

Figure 3:
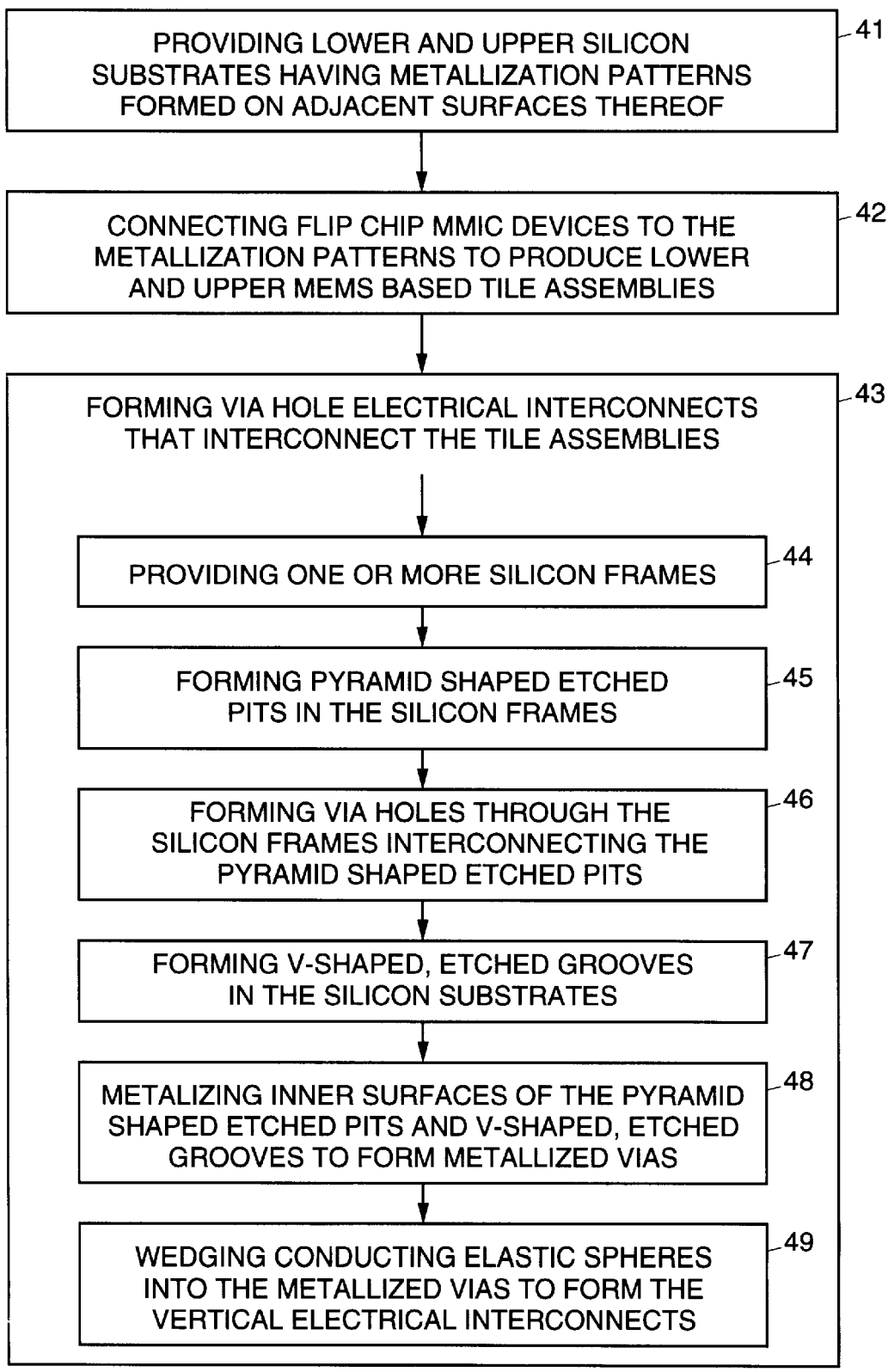
FIG. 3 is a flow diagram that illustrates a fabrication method in accordance with the principles of the present invention.

FIG. 3 is a flow diagram that illustrates a fabrication method 40 in accordance with the principles of the present invention for manufacturing MEMS based tile assemblies 20 that may be used as large area micro-machined multi-tile, phased array antenna transmit/receive subsystems for use in a large area micro-machined phased array. The fabrication method 40 for producing the MEMS based tile assemblies 20 comprises the following steps.

Lower and upper silicon substrates 21 having metallization patterns formed on adjacent surfaces thereof are provided 41. Flip chip MMIC devices 29 are connected 42 to the metallization patterns to produce lower and upper MEMS based tile assemblies 20. Vertical via hole electrical interconnects 22 that interconnect the tile assemblies 20 are formed 43 by: providing 44 one or more silicon frames 24, forming 45 pyramid shaped etched pits 23 in the silicon frames 24, forming 46 via holes 31 through the silicon frames interconnecting the pyramid shaped etched pits forming 47 V-shaped, etched grooves 25 in the silicon substrates 21, metallizing 48 inner surfaces of the pyramid shaped etched pits and V-shaped, etched grooves to form metallized vias 27, and wedging 49 conducting elastic spheres 26 into the metallized vias 27 to form the vertical electrical interconnects.

Thus, an improved MEMS based tile assemblies and method of fabricating such tile assemblies that may be used to produce large area micro-machined phased arrays has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A MEMS based tile assembly comprising:

lower and upper silicon substrates;

flip chip MMIC devices attached to the lower and upper silicon substrates; and a plurality of silicon frames interconnecting the lower and upper silicon substrates that provide vertical electrical interconnects between the silicon substrates and the flip chip MMIC devices that comprise:

a plurality of pyramid shaped etched pits formed in opposite surfaces of the silicon frames;

via holes formed through the silicon frames interconnecting the pyramid shaped etched pits;

V-shaped, etched grooves formed in the silicon substrates;

metallization formed on inner surfaces of the etched pits, the etched grooves and the via holes to form metallized vias; and conducting elastic spheres wedged between adjacent metallized etched pits and etched grooves.

2. The tile assembly recited in claim 1 wherein the diameter of the elastic spheres is large enough so that they are slightly compressed at contact areas at surface of the spheres and the inner wall of the etched inverted pyramids formed by the V-shaped, etched grooves.

3. The tile assembly recited in claim 1 wherein the spheres are elastic enough so that opposing surfaces of the silicon tiles are pressed against one another with the spheres wedged between them.

4. The tile assembly recited in claim 2 wherein the spheres are elastic enough so that opposing surfaces of the silicon tiles are pressed against one another with the spheres wedged between them.

* * * * *